(12) United States Patent
Hembacher et al.

(10) Patent No.: US 9,046,794 B2
(45) Date of Patent: Jun. 2, 2015

(54) CLEANING MODULE, EUV LITHOGRAPHY DEVICE AND METHOD FOR THE CLEANING THEREOF

(75) Inventors: Stefan Hembacher, Bobingen (DE); Dieter Kraus, München (DE); Dirk Heinrich Ehm, Lauchheim (DE); Stefan-Wolfgang Schmidt, Aalen (DE); Stefan Koehler, Rainau (DE); Almut Czap, Aalen (DE); Stefan Wiesner, Lauchheim (DE); Hin Yiu Anthony Chung, Elchingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 597 days.

(21) Appl. No.: 12/883,247

(22) Filed: Sep. 16, 2010

(65) Prior Publication Data

US 2011/0043774 A1 Feb. 24, 2011

(30) Foreign Application Priority Data

Mar. 17, 2008 (DE) .......................... 10 2008 000 709

(51) Int. Cl.
*G03F 7/20* (2006.01)
(52) U.S. Cl.
CPC .................................. *G03F 7/70925* (2013.01)
(58) Field of Classification Search
CPC ............ G03F 7/70925; G03F 7/70908; G03F 7/70916
See application file for complete search history.

(56) References Cited

U.S. PATENT DOCUMENTS

| 3,458,743 | A | * | 7/1969 | Thompson, Jr. et al. .. 313/363.1 |
| 4,737,637 | A | * | 4/1988 | Knauer ........................ 250/281 |
| 6,192,897 | B1 | | 2/2001 | Klebanoff et al. |
| 2002/0053353 | A1 | | 5/2002 | Kawata et al. |
| 2004/0011381 | A1 | * | 1/2004 | Klebanoff et al. ................. 134/2 |
| 2004/0099638 | A1 | * | 5/2004 | Miller .............................. 216/94 |
| 2004/0218157 | A1 | | 11/2004 | Bakker et al. |
| 2005/0057734 | A1 | * | 3/2005 | Johannes Stevens et al. .. 355/30 |
| 2006/0115771 | A1 | | 6/2006 | Wilhelmus Van Herpen et al. |
| 2006/0163500 | A1 | | 7/2006 | Inoue et al. |

(Continued)

FOREIGN PATENT DOCUMENTS

| EP | 1429189 A1 | 6/2004 |
| JP | 5-279884 A | 10/1993 |
| JP | 2004207740 A | 7/2004 |

(Continued)

*Primary Examiner* — Peter B Kim
*Assistant Examiner* — Michelle Iacoletti
(74) *Attorney, Agent, or Firm* — Edell, Shapiro & Finnan, LLC

(57) ABSTRACT

In order to clean optical components (35) inside an EUV lithography device in a gentle manner, a cleaning module for an EUV lithography device includes a supply line for molecular hydrogen and a heating filament for producing atomic hydrogen and hydrogen ions for cleaning purposes. The cleaning module also has an element, (33) arranged to apply an electric and/or magnetic field, downstream of the heating filament (29) in the direction of flow of the hydrogen (31, 32). The element can be designed as a deflection unit, as a filter unit and/or as an acceleration unit for the ion beam (32).

40 Claims, 7 Drawing Sheets

(56) References Cited

U.S. PATENT DOCUMENTS

| | | |
|---|---|---|
| 2006/0175558 A1 | 8/2006 | Bakker et al. |
| 2007/0069160 A1 | 3/2007 | Banine et al. |
| 2007/0125964 A1 | 6/2007 | Van Herpen et al. |
| 2007/0145296 A1 | 6/2007 | Freriks et al. |
| 2008/0083878 A1* | 4/2008 | Ehm et al. .................. 250/372 |
| 2011/0058147 A1* | 3/2011 | Ehm et al. .................. 355/30 |
| 2011/0188011 A1* | 8/2011 | Ehm et al. .................. 355/30 |

FOREIGN PATENT DOCUMENTS

| | | |
|---|---|---|
| JP | 2007110107 A | 4/2007 |
| WO | 2006136967 A2 | 12/2006 |
| WO | 2007064210 A1 | 6/2007 |
| WO | 2008034582 A2 | 3/2008 |

\* cited by examiner

CLEANING MODULE, EUV LITHOGRAPHY DEVICE AND METHOD FOR THE CLEANING THEREOF

This is a Continuation of International Application PCT/EP2009/051330, with an international filing date of Feb. 5, 2009, which was published under PCT Article 21(2) in German, and the complete disclosure of which, including amendments, is incorporated into this application by reference.

FIELD OF AND BACKGROUND OF THE INVENTION

The present invention relates to a cleaning module for the cleaning of components of an EUV lithography device comprising a heating unit, and to a cleaning module for an EUV lithography device with a supply line for molecular hydrogen and a heating filament for producing atomic hydrogen for cleaning purposes, as well as to an EUV lithography device or a projection system or an illumination system for an EUV lithography device with such a cleaning module. Moreover, the present invention relates to methods for the cleaning of a component inside an EUV lithography device.

In extreme-ultraviolet lithography devices, reflective optical elements for the extreme ultraviolet (EUV) or soft x-ray wavelength range (e.g. wavelengths between approx. 5 nm and 20 nm), such as for example photomasks and multilayer mirrors, are used for the lithography of semiconductor components. Since EUV lithography devices usually comprise a plurality of reflective optical elements, these elements must possess as high a reflectivity as possible in order to ensure a sufficiently high total reflectivity. The reflectivity and the service life of the reflective optical elements can be reduced by contamination of the optically used reflective area of the reflective optical elements, said contamination arising on account of the shortwave radiation together with residual gases in the operating atmosphere. Since a plurality of reflective optical elements are usually arranged behind one another in an EUV lithography device, even fairly small levels of contamination on each individual reflective optical element have a quite considerable effect on the total reflectivity.

In particular, the optical elements of an EUV lithography device can be cleaned in situ with the aid of, for example, atomic hydrogen, which reacts with, in particular, carbon-containing contamination to form volatile compounds. In order to obtain the atomic hydrogen, molecular hydrogen is often conveyed onto a heating filament. Metals or metal alloys with a particularly high melting point are used for the heating filament. So-called cleaning heads comprising a hydrogen supply line and an incandescent filament are arranged in the vicinity of mirror surfaces in order to clean them free from contamination. The volatile compounds, which are formed in the reaction of the atomic hydrogen with the, in particular, carbon-containing contamination, are pumped away with the normal vacuum system.

It has been a problem with the previous approach that, on the one hand, the cleaning heads are supposed to be arranged relatively close to the mirrors in order to achieve a high cleaning efficiency. On the other hand, reflective optical elements optimized precisely for the EUV or soft x-ray wavelength region are often sensitive to heat. Excessive heating of the mirrors during the cleaning leads to a deterioration in their optical properties. Hitherto, therefore, mirror cooling has been provided during the cleaning or the cleaning has been carried out as pulsed cleaning with cooling phases. Furthermore, with the production of atomic hydrogen via thermionic electrons from, for example, an incandescent or heating filament, the problem arises that the filament material can contaminate the surface to be cleaned.

SUMMARY OF THE INVENTION

It is an object of the present invention to improve the known cleaning heads such that a more gentle cleaning of the optical elements is enabled.

This object is achieved by a cleaning module for the cleaning of components of an EUV lithography device which comprises a heating unit, past which molecular gas can flow in order to convert it at least partially into ions, and which comprises at least one electromagnetic deflection unit in order to change the direction of motion of ions.

This object is also achieved by a cleaning module for an EUV lithography device with a supply line for molecular gas and a heating filament for the production of atomic gas for cleaning purposes, as well as an element applying an electric and/or magnetic field and arranged downstream of the heating filament in the flow direction of the atomic gas (e.g. hydrogen).

The element applying an electric and/or magnetic field, respectively the electromagnetic deflection unit, makes it possible to spatially deflect the produced atomic gas, preferably produced atomic hydrogen, insofar as it is in ionized form, or the ionized gas. The heating filament for the production of atomic gas, preferably atomic hydrogen, or the heating unit for the ionization of molecular gas, can thus be positioned such that there is no free line of sight (i.e. no unimpeded travel) between the heating filament or the heating unit on the one hand and a component to be cleaned or an area to be cleaned on the other. On the contrary, the hydrogen atoms present as ions or other ions are deflected by electric and/or magnetic fields to the site to be cleaned. The area to be cleaned is therefore no longer directly exposed to the thermal radiation of the heating filament or the heating unit or to contamination with material of the heating filament or the heating unit, this being a considerable advantage especially in the case of mirrors for the EUV or soft x-ray wavelength region. This is because such mirrors are often provided with heat-sensitive multilayer systems, which endow them with their optical capabilities. The temperature sensitivity of the multilayer coating of a mirror for the EUV or soft wavelength range limits the cleaning time and therefore the cleaning efficiency per cleaning cycle. The required cleaning time is thus increased and this reduces the production time. The cleaning efficiency with conventional cleaning modules is also reduced by the fact that the surface to be cleaned may be contaminated by material emerging from the filament or the heating unit during heating. As a result of the enabled gentle and at the same time target-orientated cleaning, the required cleaning time can be reduced, additional contamination can be avoided and the production time can thus be lengthened.

Furthermore, this object is achieved by an EUV lithography device or a projection system or an illumination system for an EUV lithography device with at least one such cleaning module.

In addition, this object is achieved by a method for the cleaning of a component inside EUV lithography devices including: ionizing a molecular gas, deflecting ions into another direction and exposing the components to be cleaned to the prepared gas.

Moreover, this object is achieved by a method for the cleaning of a component inside EUV lithography devices including: producing atomic cleaning gas on a heating filament and deflecting the atomic cleaning gas with an electric and/or magnetic field onto the component to be cleaned.

By the fact that the part of the atomic cleaning gas, preferably the atomic hydrogen, which is present in an ionized state, respectively that the ion share of a cleaning gas is deflected with an electric and/or magnetic field onto the component to be cleaned, it is possible to position the heating filament and the component to be cleaned with respect to one another in such a way that the component to be cleaned is not directly exposed to the thermal radiation of the heating filament, which leads to a longer service life of the component on account of the lower heat input.

It should be pointed out that, apart from ionized hydrogen, any charged particles, in particular other ionized cleaning gases, are suitable for the comparatively gentle and the target-orientated cleaning described here, especially ions of atoms or molecules, which react with the contamination to be removed to form volatile compounds, or of noble gases, which can clean the surface predominantly through a sputtering effect.

BRIEF DESCRIPTION OF THE DRAWINGS

The present invention will be explained in greater detail with reference to exemplary embodiments. In the Figures.

DETAILED DESCRIPTION OF EXEMPLARY EMBODIMENTS

Figure 1:
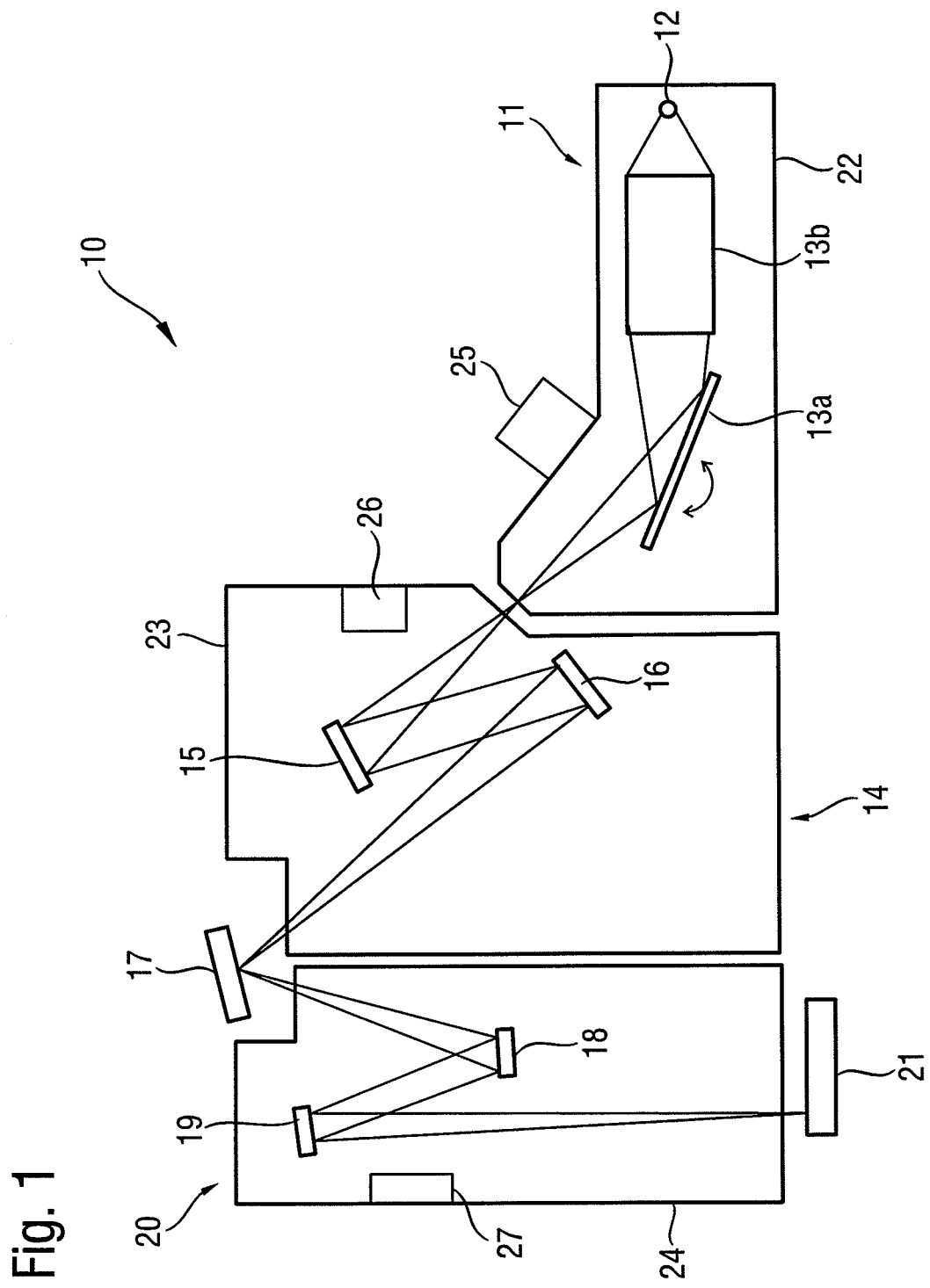
FIG. 1 shows schematically an embodiment of an EUV lithography device.

An EUV lithography device 10 is represented schematically in FIG. 1. Main components are a beam shaping system 11, an illumination system 14, a photomask 17 and a projection system 20. The EUV lithography device 10 is operated under vacuum conditions or in special atmospheres with a low partial pressure of a gas or a combination of gases, in order that the EUV radiation is absorbed or scattered as little as possible in its interior. In the present example, a pressure of approx. $10^{-4}$ mbar or less is complied with for this purpose, also with a special atmosphere.

A plasma source or also a synchrotron can for example be used as radiation source 12. The emerging radiation in the wavelength range from approx. 5 nm to 20 nm is first bundled in collimator 13b. Moreover, the desired operating wavelength can be filtered out with the aid of a monochromator 13a by varying the angle of incidence. In the stated wavelength range, collimator 13b and monochromator 13a are usually constituted as reflective optical elements. Collimators are often reflective optical elements constituted saucer-shaped in order to achieve a focusing or collimating effect. The reflection of the radiation takes place at the concave face, a multilayer system often not being used on the concave face for the reflection, since as broad a wavelength range as possible should be reflected. The filtering out of a narrow wavelength band by reflection takes place at the monochromator, often with the aid of a grid structure or a multilayer system.

The operating beam prepared in beam shaping system 11 with regard to wavelength and spatial distribution is then introduced into illumination system 14. In the example represented in FIG. 1, illumination system 14 comprises two mirrors 15, 16 that are constituted as multilayer mirrors in the present example. Mirrors 15, 16 guide the beam onto photomask 17, which comprises the structure, which is to be imaged onto wafer 21. Photomask 17 is also a reflective optical element for the EUV and soft wavelength region, said element being replaced depending on the production process. With the aid of projection system 20, the beam reflected by photomask 17 is projected onto wafer 21 and the structure of the photomask is thus imaged onto said wafer. In the example shown, projection system 20 comprises two mirrors 18, 19, which in the present example are also constituted as multilayer mirrors. It should be pointed out that both projection system 20 as well as illumination system 14 can each also comprise only one or also three, four, five or more mirrors.

Beam shaping system 11 as well as illumination system 14 as well as projection system 20 are constituted as vacuum chambers 22, 23, 24, since multilayer mirrors 15, 16, 18, 19, in particular, can only be operated in a vacuum or a special atmosphere. Otherwise, too much contamination would be deposited on their reflective surface, which would lead to excessive deterioration of their reflectivity. Photomask 17 is therefore also located in a vacuum or a special atmosphere. For this purpose, it can be located in its own vacuum chamber or can be integrated into another vacuum chamber 23, 24.

Cleaning modules 25, 26, 27 are provided in the example shown in FIG. 1 for the cleaning especially of the reflective optical elements. The cleaning modules can be provided either inside vacuum chambers, as in the case of illumination system 23 and projection system 20, such that cleaning modules 26, 27 are arranged in each case on the inside of vacuum chambers 23, 24. They can also be provided outside a vacuum chamber, as in the case of beam shaping system 11 in the present example, wherein cleaning module 25 is arranged on the outside of vacuum chamber 22. In this case, a connection is provided between the cleaning module and vacuum chamber 22, through which the atomic hydrogen required for the cleaning can pass. If individual or a plurality of optical elements, for example mirrors 15, 16, 18, 19 or monochromators 13a or collimators 13b, are enclosed separately in a housing having its own vacuum system, the cleaning modules can also be arranged inside such a housing. A cleaning module can also be provided for photomask 17.

In the present example, cleaning modules 25, 26, 27 are used for the cleaning of mirror surfaces. They are however also suitable for the cleaning of any other components inside EUV lithography device 10.

According to a first embodiment, hydrogen supply lines are provided inside cleaning modules 25, 26, 27 in order to conduct molecular hydrogen onto a heating filament. In further variants, supply lines for gases other than hydrogen can be provided for cleaning purposes. A tungsten filament is preferably used as the heating filament, which can be heated up to 2000° C. in order to achieve a high splitting rate in atomic hydrogen. The produced atomic hydrogen is present partially in ionized form. This is used to deflect the ionized atomic hydrogen in a targeted manner through electric or magnetic or electromagnetic fields and to guide the ionized hydrogen onto the area to be cleaned in each case. Cleaning modules 25, 26, 27 can therefore now be arranged in EUV lithography device 10 in such a way that the components to be cleaned, such as for example mirrors 15, 16, 18, 19 or monochromator 13a and collimator 13b, are no longer exposed directly to the thermal radiation of the tungsten filament. As a result of the controllability of the hydrogen beam, it is now also possible to provide a cleaning module for different optical elements to be cleaned. Depending on the requirements on the cleaning efficiency and depending on the geometric configurations inside an EUV lithography device or its projection system or illumination system, one or more separate cleaning modules can also be provided for each object to be cleaned or each area to be cleaned.

Figure 2A:
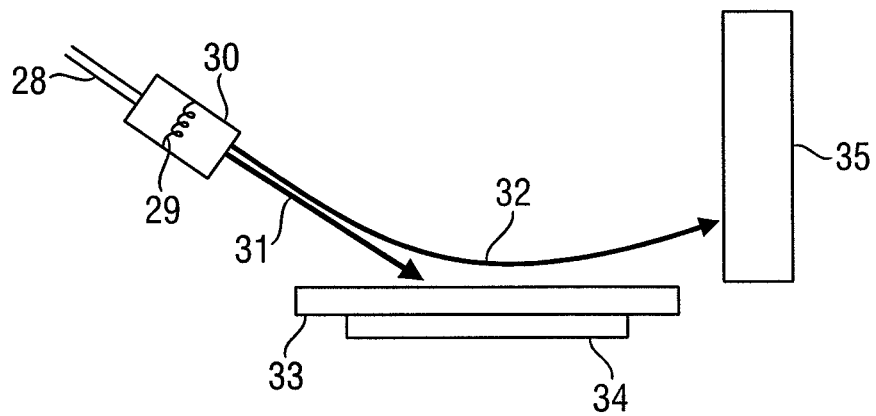
FIGS. 2a,b show schematically a first embodiment of a cleaning module with a variant.

A first preferred embodiment of a cleaning module is represented schematically in FIGS. 2a, b. A heating filament 29 is arranged in a housing 30. Molecular hydrogen is supplied to this heating filament 29 via hydrogen supply line 28, said molecular hydrogen being split into atomic hydrogen by the heating effect of heating filament 29. A hydrogen partial flow 31 thus arises, which is composed partially of non-split molecular hydrogen and non-ionized atomic hydrogen and which further comprises a partial flow 32 essentially consisting of hydrogen ions. The two partial flows 31, 32 emerge from housing 30 in such a way that they flow towards a deflection element 33. In the present example, deflection element 33 is constituted plate-shaped. It is positively charged, so that it has a deflecting influence on partial flow 32 with hydrogen ions. This is because the hydrogen ions are positively charged and repelled by deflection element 33. Ion beam 32 is thus guided onto the surface of component 35 to be cleaned. As a result of the basic structure, it is possible to achieve an effect such that the direction of ion beam 32 is decoupled from the direction of the thermal beam, which coincides with the beam direction of non-ionized hydrogen 31. Heating of the surface of component 35 to be cleaned is thus avoided, which in the case of a mirror surface would lead to a deformation or shift of the optical mirror surface, so that the imaging characteristic would be adversely affected.

Deflection element 33 can be made for example of metal, blackened or dark metal surfaces being particularly preferable. Anodized aluminum is used with very particular preference. This serves to absorb heat from hydrogen ion beam 32. In order to enhance this effect still further, a cooling device 34 in thermal contact with deflection element 33 is additionally provided in the example represented in FIG. 2a. Cooling device 34 serves as a heat reservoir, into which heat from hydrogen ion beam 32 can flow away. The heat input into component 35 is thus further reduced. In addition, deflection plate 33 is connected to a charge reservoir, e.g. in the form of a voltage source, in order to be able to maintain deflection element 33 continuously at a positive potential. Hydrogen ion beam 32 can be controlled by varying the potential.

Figure 2B:
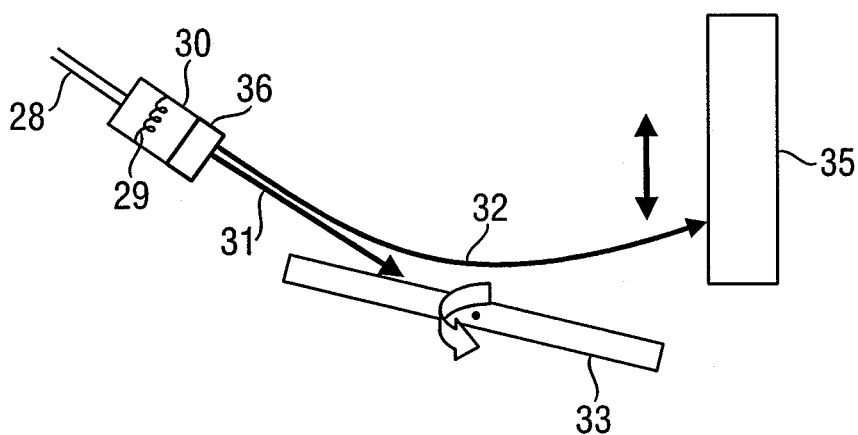

The example represented in FIG. 2b differs from the example represented in FIG. 2a in that an ionization device 36 is additionally provided between heating filament 29 and deflection element 33. Ionization device 36 serves to increase the proportion of ionized hydrogen. The ionization preferably takes place by collision ionization or electric field ionization. The collision ionization can in particular also be ionization with high-energy photons, for example from the ultraviolet or the x-ray wavelength region. Depending on the desired cleaning efficiency, it may be necessary to have more or less ionized hydrogen in hydrogen ion beam 32 with which component 35 is cleaned. This can be adjusted by ionization device 36.

Moreover, deflection element 33 is arranged in a mobile manner. In the present example, it can rotate about an axis as symbolized by the arrow. The effect of a rotation of deflection element 33 is that hydrogen ion beam 32 is moved up and down relative to the area of component 35 to be cleaned, as is indicated by the double arrow. This enables targeted scanning of the surface to be cleaned. Deflection element 33 particularly preferably has up to six degrees of freedom, in order for it to be able to move freely in space and for hydrogen ion beam 32 thus to be able to be positioned arbitrarily on areas to be cleaned.

Figure 3:
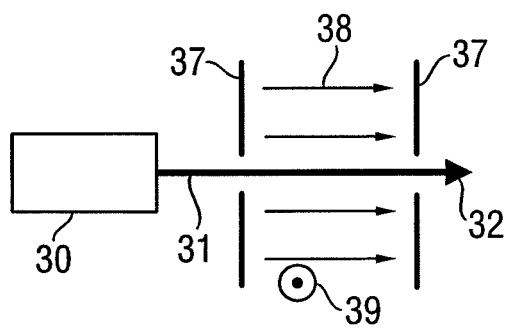
FIG. 3 shows schematically a second embodiment of a cleaning module.

In the example of embodiment represented in FIG. 3, there are arranged in the flow direction downstream of the heating filament (not represented in FIG. 3), which is located in housing 30, plates 37 in order to be able to apply an electric field 38, and in addition a magnet, which is not represented here, in order to apply a magnetic field 39. Both fields 38, 39 are essentially homogeneous fields, which are oriented normal to one another. This spatial arrangement is also called a Wien filter and serves to filter out hydrogen ions 32 of a specific energy range from hydrogen beam 31. The energy range is preferably selected such that the hydrogen ions have an energy, which is so small that no sputtering effects occur. This is because sputtering could lead to a destruction of the surface that is being cleaned, this being undesirable especially when cleaning multilayer mirrors. Depending on the nature of the contamination to be removed and depending on the surface to be cleaned, however, it may also be advantageous to select the energy range so high that removal of the contamination can occur not only through a chemical reaction but also mechanically through sputtering.

Plates 37 also serve, moreover, to shield off the area or component to be cleaned against the thermal radiation, which is emitted from the heating filament to generate the atomic hydrogen.

The element shown in FIG. 3 for applying an electric field 38 and a magnetic field 39 can be combined for example with deflection element 33 from the example of embodiment shown in FIGS. 2a, b, an arrangement of the deflection element in front of the Wien filter and also behind the Wien filter being possible. Further elements for applying electric and/or magnetic fields, e.g. electric lenses, can also be provided in order to form ion beam 32 and/or in order to scan the surface of a component to be cleaned in a more targeted manner with a beam 32. A unit for filtering the ions according to their mass can additionally be used.

Figure 4A:
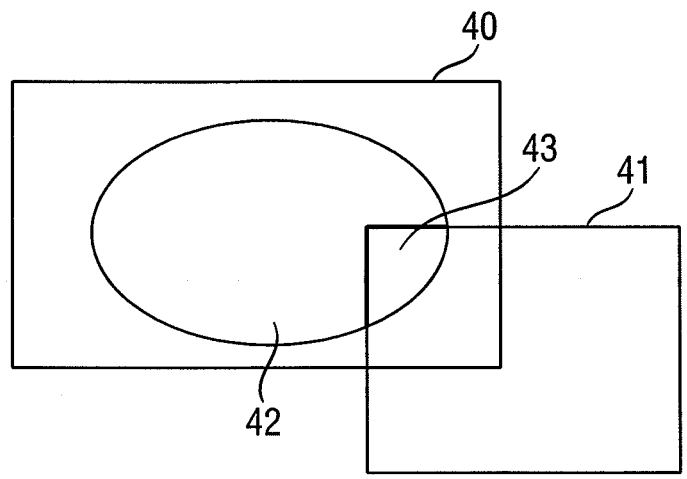
FIGS. 4a,b show schematically the cleaning method.

The execution of the cleaning of a component inside an EUV lithographic device according to a first embodiment will now be dealt with in somewhat greater detail with reference to FIGS. 4a, b and 5. Since there is only limited space available in the interior of an EVU lithographic device or a projection system or an illumination system for an EVU lithographic device, it often happens that different components 41, 40, as represented in FIG. 4a, partially shadow one another. In the situation represented in FIG. 4a, component 41 is arranged in the flow direction of the hydrogen upstream of component 40, whose surface is intended to be cleaned. When use is made of conventional cleaning modules, wherein a heating filament is arranged in the vicinity of a component to be cleaned, so that the produced atomic hydrogen can directly strike the area to be cleaned, whole area 42 would be exposed to atomic hydrogen. However, since component 41 protrudes into the hydrogen cone, component 41 is partially exposed to atomic hydrogen, which may be undesirable, since reactions of atomic hydrogen with the material of component 41 may occur. Moreover, no hydrogen atoms arrive in the region of component 40 downstream of component 41, so that this region cannot be adequately cleaned.

Figure 5:
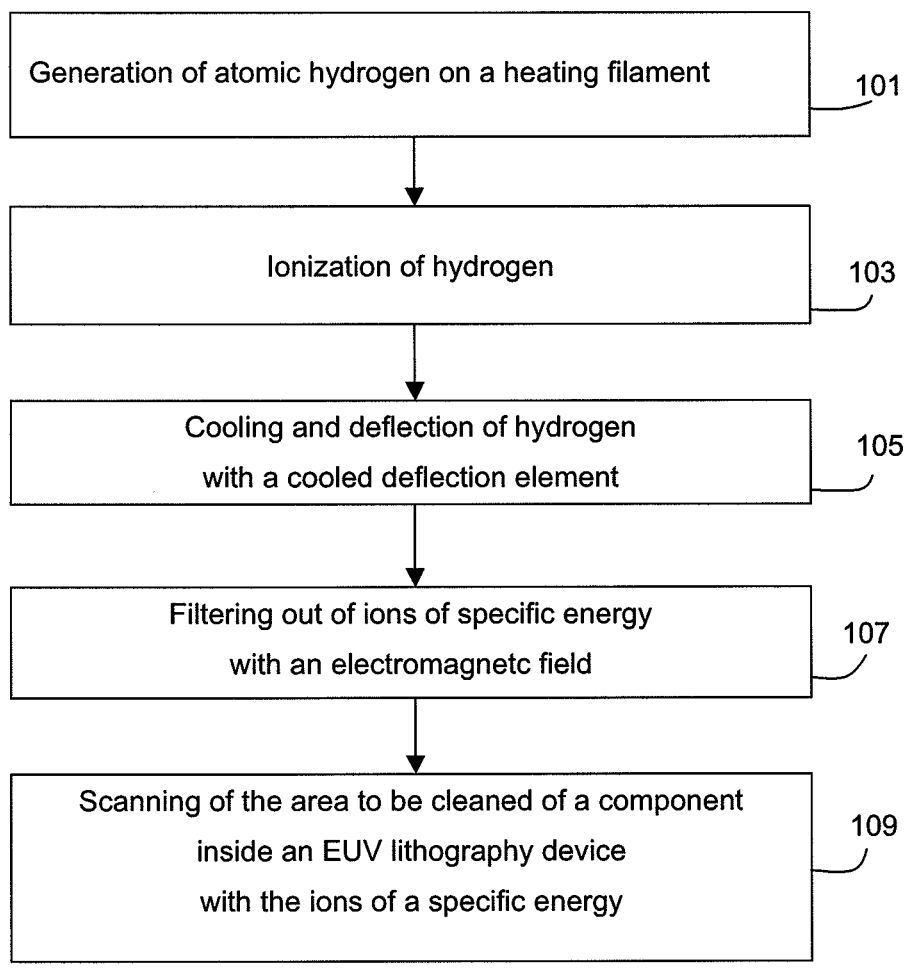
FIG. 5 shows a flow diagram in respect of an embodiment of a first cleaning method.

By using the cleaning module proposed here, it is possible to clean areas of component 40 in a targeted manner without component 41 essentially coming into contact with atomic hydrogen. For this purpose, atomic hydrogen is first generated on a heating filament (see FIG. 5, step 101), as also in the past. In the present example, the atomic hydrogen is then ionized (step 103). This preferably takes place by collision ionization or electric field ionization. In the case of collision ionization, it may in particular also involve ionization with high-energy photons, for example from the ultraviolet or the x-ray wavelength region. The hydrogen beam with a high proportion of hydrogen ions is directed with of a cooled deflection element, for the purpose of cooling and deflecting the beam, in the direction of the area to be cleaned (step 105), the deflection element being positively charged. Ions having a specific energy are then filtered out using an electromagnetic field (step 107), in order to carry out chemical and/or mechanical cleaning of the area to be cleaned depending on the surface to be cleaned and depending on the contamination to be removed. The penetration of contaminating material of the heating filament can thus be additionally suppressed. With this specially prepared hydrogen ion beam, the area of a component to be cleaned inside an UV lithography device is scanned with ions having a specific energy (step 109).

Figure 4B:
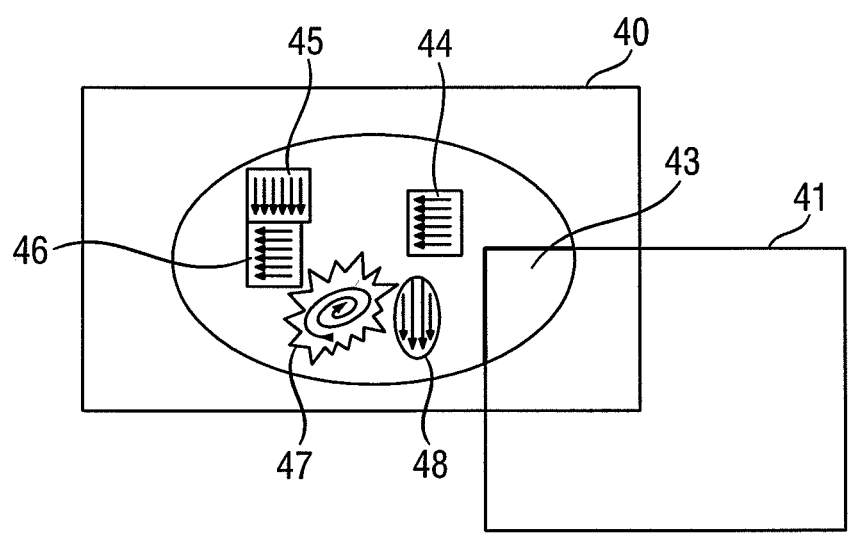

This is represented in FIG. 4b with the aid of components 41, 40. With the method described here, it is possible to scan individual areas 43 to 47 in a targeted manner. The scanning direction is symbolized by the arrows and is arbitrary. Component 41 is now not exposed to hydrogen ions. By the application of additional magnetic fields, moreover, regions of the area can be reached which lie in the region shadowed by component 41. Cleaning can be adapted to the actual cleaning requirement in each case with the aid of the prepared and deflectable hydrogen ion beam. Instead of cleaning large regions of the area without differentiation, the hydrogen beam is directed solely onto regions 43 to 47 of the area with contamination to be removed. Moreover, the hydrogen beam is prepared in terms of energy in such a way that the required cleaning performance is achieved. The cleaning performance is determined not only by the energy of the hydrogen ions, but also by the speed at which a region 43 to 47 of the area is scanned.

It should be pointed out that not only ionized hydrogen is suitable for the gentle and target-orientated cleaning described here, but any charged particles, in particular ions of atoms or molecules which react with the contamination to be removed to form volatile compounds. In further embodiments, therefore, other cleaning gas instead of hydrogen can be supplied and converted into atomic cleaning gas.

Figure 6:
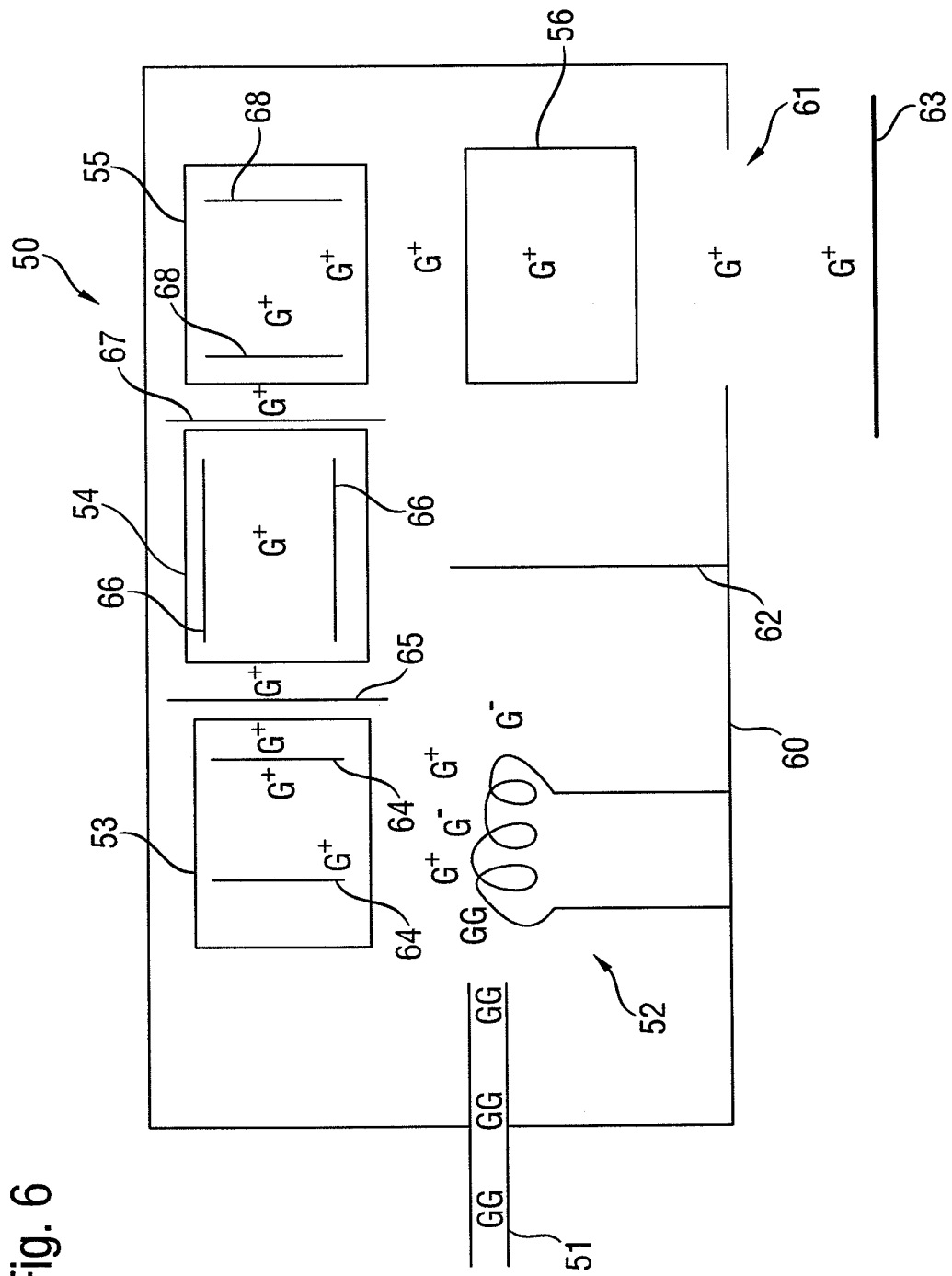
FIG. 6 shows schematically a first variant of a third embodiment of a cleaning module.

An example of a further embodiment of a cleaning module 50 is represented in FIG. 6, wherein arbitrary gases GG are prepared for the cleaning of surfaces. Gas GG is introduced via gas supply line 51 into housing 60 and brought into the vicinity of heating unit 52. In the present example, heating unit 52 is constituted as a heating filament, from which thermionic electrons emerge which ionize gas GG at least partially to form positive ions $G^+$ and negative ions $G^-$. In further embodiments, the heating unit can also be a plasma source or it can comprise heating elements, which are constituted in an arbitrarily different manner.

The selection of the kind of heating unit 52 depends on the gas to be ionized and the desired ionization rate. In the case of the embodiment as a heating filament, the heating filament material can also be selected with regard to the cleaning gas and the ionization rate. Preferred materials are for example tungsten, osmium, iridium and rhenium. To a certain extent, the ionization rate can be influenced by the voltage or current applied to the heating filament. It should be noted that, in the case of gases with smaller atomic radii, less energy has to be supplied than in the case of gases with a larger atomic radius in order to achieve ionization. This applies in particular to the use of noble gases.

Housing 60 has, for instance, the function of separating the atmospheres inside and outside of cleaning module 50 from one another. Pressure fluctuations outside cleaning module 50 can thus be compensated for inside cleaning module 50 in order to ensure a constant generation of ions. Such pressure fluctuations can occur, for example, when the interior of the EUV lithography device or one of its optical systems such as, for example, the illumination system or the projection system is being pumped off on account of a raised contamination risk. By way of support, a diaphragm can be arranged at outlet 61 in order to separate the volume inside housing 60 from the surroundings, and/or cleaning module 50 can comprise a pump with a suction power regulator. The diaphragm can also contribute towards ensuring that as few contaminants as possible exit from cleaning module 50 and contaminate component 63 to be cleaned. The free path length of the ions can also be adjusted via the pressure inside cleaning module 50. The kinetic energy of the ions and the probability of their emergence from housing 60 can thus be influenced.

The ions formed at heating unit 52 move, e.g., towards electromagnetic deflection unit 53, in which the ions are deflected into different directions by electric and/or magnetic fields depending on their polarity. For this purpose, deflection unit 53 can for example include deflection electrodes 64, as represented schematically in FIG. 6.

For the sake of clarity, only positive ions $G^+$ are represented in FIG. 6. In order to shield off undesired ions or molecules, a partition wall 62 is provided inside housing 60 between heating unit 52 and outlet 61, from which the particles of the cleaning gas prepared for the cleaning emerge.

As a result of the deflection of the ions, it is ensured that a line of sight between heating unit 52 and component 63 to be cleaned is avoided, in order to keep the thermal load on component 63 as low as possible. The ions are preferably deflected by an angle between 60° and 120°, particularly preferably between 80° and 100°, very particularly preferably by approx. 90°. As an additional measure, component 63 can also be exposed in a pulsed manner to the prepared cleaning gas, i.e. with interruptions in which component 63 can cool down again, and/or over such short time intervals that component 63 heats up only within a tolerable temperature range during the exposure to the cleaning gas. For this purpose, gas supply line 51 and/or one or more of electromagnetic units 53, 54, 55, 56 can be operated in a pulsed manner.

The positive ions then pass through electromagnetic filter unit 54, the magnetic fields and/or electric fields whereof are adjusted in such a way that only ions having a mass in a specific mass range pass through filter unit 54. In order to increase the precision of the mass filtering, a pinhole 65 can be arranged between deflection unit 53 and filter unit 54, as represented schematically in FIG. 6. The mode of functioning of filter unit 54 essentially corresponds to that of a mass spectrometer. Filter unit 54 is particularly advantageous when a gas mixture is made available as a cleaning gas and the cleaning is intended to be carried out preferably with one or another component of the gas mixture at different times. Moreover, filter unit 54 makes it possible to stop contaminating ions, for example of a material of heating unit 52 or of housing 60 or of partition wall 62, so that they do not contaminate the surface of component 63 to be cleaned. Filter unit 54 can for example comprise a quadrupole magnet 66.

In the present example, the ions emerging from filter unit 54 are again deflected inside a further deflection unit 55 and directed to an electromagnetic acceleration unit 56. In the example represented schematically in FIG. 6, deflection unit 55 also comprises deflection electrodes 68 and a pinhole 67 is arranged between filter unit 54 and deflection unit 55. In acceleration unit 56, the previously selected ions are brought to the kinetic energy for the cleaning of the surface of component 63 preferably using electric fields which can be generated for example by acceleration electrodes (not shown). The kinetic energy can also be changed during the cleaning process. Depending on the contamination to be removed, it may be advantageous to work, for example, first with high-energy particles and to reduce the energy at the end of the cleaning process in order to proceed in a more gentle manner, in order that the surface lying beneath the contamination, for example, is not damaged. In addition, it is also possible, by regulating heating unit 52, to reduce the ionization rate and/or to deflect and/or filter out other ions and/or to supply another cleaning gas. Moreover, the area to be cleaned can be scanned with the ion beam with the aid of deflection unit 55.

Figure 7:
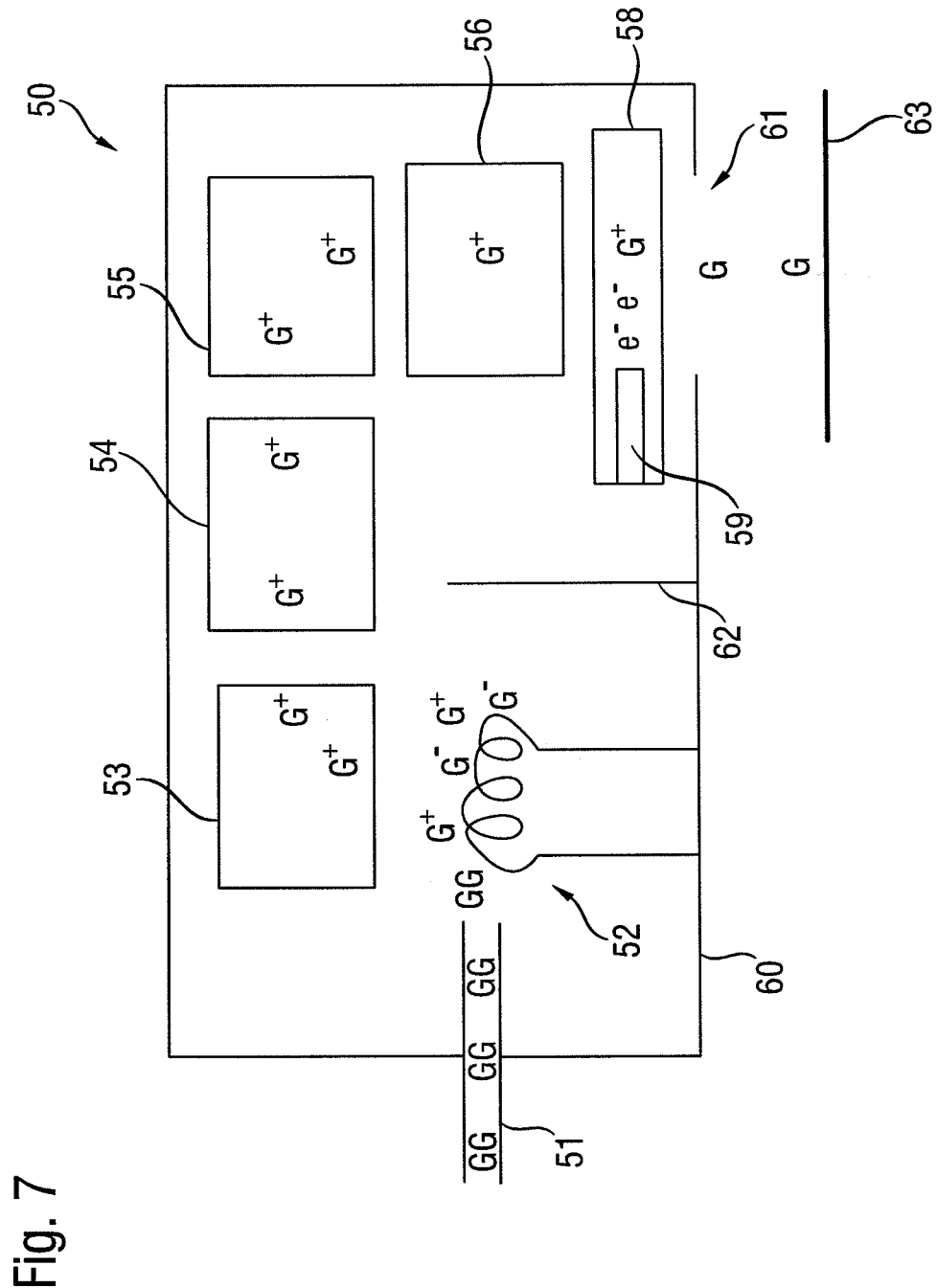
FIG. 7 shows schematically a second variant of a third embodiment of a cleaning module.

A variant of the embodiment shown in FIG. 6 is represented in FIG. 7. It differs from the embodiment shown in FIG. 6 in that a radical generation unit 58 is arranged, in the ion flow direction, downstream of deflection units 53, 55, filter unit 54 and acceleration unit 56. Depending on the surface to be cleaned or the contamination to be removed, it may be advantageous to work with radicals of the cleaning gas instead of with ions of the cleaning gas.

Moreover, it should be pointed out that each deflection unit, filter unit, acceleration unit and optionally radical generation unit can be provided either singly or multiply in the cleaning module, the arrangement of the electromagnetic units, such as deflection unit, filter unit and acceleration unit, being arbitrary. Moreover, each unit can include any device for generating electric, magnetic or electromagnetic fields, which the person skilled in the art can select for example according to the geometry of the module and the surroundings in which it is intended to be used, or according to the desired cleaning particles. The radical generation unit is preferably arranged following the electromagnetic units, as in the example represented in FIG. 7. This is because radicals can scarcely be influenced by the electromagnetic units.

The example of a radical generation unit 58 represented in FIG. 7 comprises an electron source 59. Electrons e⁻ interact with positive ions G⁺ in order to convert them into uncharged radicals G, which act on the contamination on component 63 to be cleaned. The radicals or the ions are preferably selected such that they react with the contamination to form volatile compounds. The energy of the radicals or ions can also be adjusted such that the removal of the contamination proceeds physically, e.g. by sputtering effects. It may also be desirable to carry out simultaneously chemical as well as physical cleaning. In the case of component 63 with a particularly sensitive surface, it may be advantageous initially to clean predominantly physically and gradually to increase the proportion of the chemical cleaning. This can be influenced by the kinetic energy, the particle density and/or the type of particles.

Figure 8:
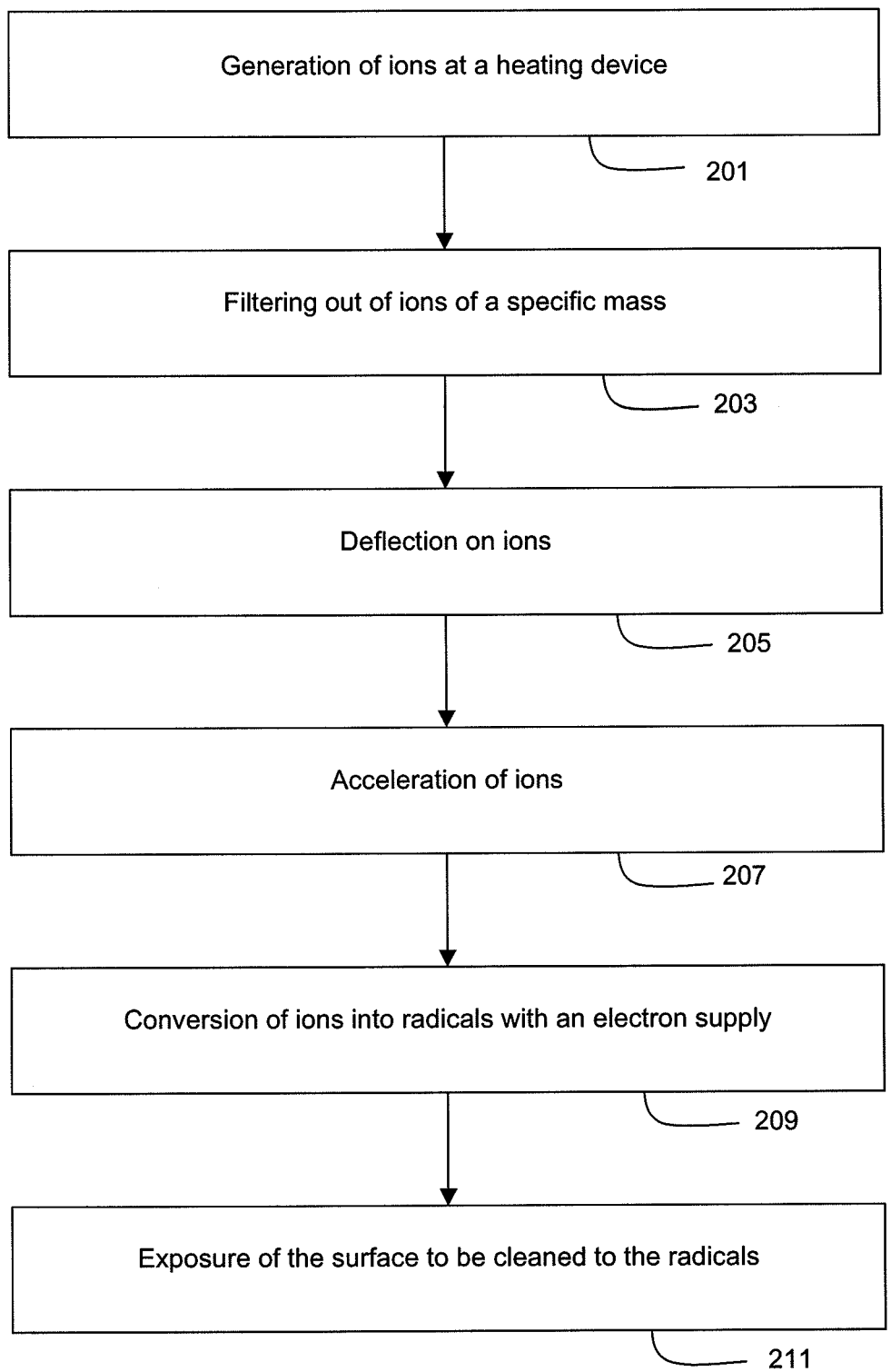
FIG. 8 shows a flow diagram in respect of an embodiment of a second cleaning method.

An example of a further embodiment of a cleaning method is shown in a flow diagram in FIG. 8. This method is preferably carried out with cleaning modules such as have been described in connection with FIGS. 6, 7.

A gas is first ionized by a heating device (step 201). Hydrogen, deuterium, tritium, noble gases, halogen gases, oxygen, nitrogen or a mixture of two or more of these gases are preferably used as the gas. Hydrogen, nitrogen and noble gases are particularly preferable. Gases, which act in a reducing manner, are particularly advantageous for a chemical cleaning effect. Noble gases are preferred for a physical cleaning effect.

The ions obtained at the heating device are filtered according to their mass (step 203), in order to obtain only the ions desired for the cleaning, and are deflected (step 205) in order that the surface to be cleaned is not exposed directly to the thermal radiation of the heating device. The ions are then accelerated to the kinetic energy desired for the given cleaning step (step 207). The step also comprises, as the case may be, a negative acceleration in order to reduce the kinetic energy of the ions.

The ions thus obtained are converted by electron bombardment into radicals (step 209), to which the surface to be cleaned is exposed (step 211).

Step 209 can also be dispensed with in a variant of this embodiment and the surface to be cleaned is exposed to the selected ions brought to the desired energy.

The above description of exemplary, preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A cleaning module for cleaning a component inside an extreme-ultraviolet lithography device, comprising:
    a source of molecular gas,
    a heating unit configured to convert the molecular gas at least partially into ions and producing a byproduct comprising a thermal beam, wherein the ions and the byproduct flow in a given flow direction,
    at least one electromagnetic deflection unit arranged to deflect the ions in a flow direction of the ions to an ion destination within the extreme-ultraviolet lithography device, wherein the flow direction of the ions differs from the given flow direction, and
    an element establishing a flow direction of the byproduct to a predetermined byproduct destination and physically segregating the byproduct destination from the ion destination, wherein the flow direction of the byproduct differs from the flow direction of the ions.

2. The cleaning module according to claim 1, wherein the element comprises at least one electromagnetic filter unit configured to filter out a portion of the ions having a given mass range from the ions.

3. The cleaning module according to claim 1, further comprising at least one electromagnetic acceleration unit configured to change kinetic energy of the ions.

4. The cleaning module according to claim 1, further comprising at least one radical generation unit.

5. The cleaning module according to claim 4, wherein the radical generation unit comprises an electron source.

6. The cleaning module according to claim 4, wherein the radical generation unit is arranged, in the flow direction of the ions, downstream of the deflection unit.

7. The cleaning module according to claim 1, further comprising a housing, in which at least the heating unit and the deflection unit are arranged, and an outlet, from which the ions exit as a prepared gas.

8. An extreme-ultraviolet lithography device comprising at least one cleaning module according to claim 1.

9. A projection system for an extreme-ultraviolet lithography device comprising at least one cleaning module according to claim 1.

10. An illumination system for an extreme-ultraviolet lithography device comprising at least one cleaning module according to claim 1.

11. The cleaning module according to claim 1, wherein the byproduct further comprises a material.

12. The cleaning module according to claim 1, wherein the ions directed to the component have masses in a given mass range and the byproduct further comprises ions in mass ranges other than the given mass range.

13. The cleaning module according to claim 1, wherein the element comprises a byproduct reservoir configured to confine the byproduct in the byproduct destination.

14. The cleaning module according to claim 1, wherein the element comprises a barrier impervious to the byproduct and provided with a pinhole for the ions.

15. A cleaning module for cleaning a component of an extreme-ultraviolet lithography device, the cleaning module comprising:
a supply line for molecular gas,
a heating unit producing a cleaning gas and producing a byproduct comprising a thermal beam, wherein the cleaning gas the atomic gas and the byproduct flow together in an initial flow direction, and
an element applying at least one of an electric field and a magnetic field and arranged downstream of the heating unit in the initial flow direction and configured to direct the cleaning gas to a cleaning gas destination within the extreme-ultraviolet lithography device in a flow direction differing from the initial flow direction and decoupled from a flow direction of the byproduct.

16. The cleaning module according to claim 15, wherein the heating unit comprises an ionization device arranged downstream of a heating filament in the flow direction of the cleaning gas.

17. The cleaning module according to claim 15, wherein the element applies an electric field and is configured as a deflection element having a positive voltage potential.

18. The cleaning module according to claim 17, further comprising a cooling device arranged against the deflection element to capture the thermal beam.

19. The cleaning module according to claim 17, wherein the deflection element is mounted with at least one degree of freedom with respect to the heating unit.

20. The cleaning module according to claim 15, wherein the byproduct further comprises a material.

21. An extreme-ultraviolet lithography device comprising at least one cleaning module according to claim 15.

22. A projection system for an extreme-ultraviolet lithography device comprising at least one cleaning module according to claim 15.

23. An illumination system for an extreme-ultraviolet lithography device comprising at least one cleaning module according to claim 15.

24. The cleaning module according to claim 15, wherein the element further comprises a byproduct reservoir configured to confine the byproduct in a byproduct destination segregated from the cleaning gas destination.

25. A method for cleaning a component mounted inside an extreme-ultraviolet lithography device, comprising:
ionizing a molecular gas and thereby producing ions and a byproduct comprising a thermal beam;
electromagnetically deflecting the ions from an initial direction of travel of both the ions and the byproduct into an altered direction of travel as a prepared gas, wherein the altered direction of travel differs from the initial direction of travel and is decoupled from a direction of travel of the byproduct; and
exposing the component while mounted inside the extreme-ultraviolet lithography device to the prepared gas.

26. The method according to claim 25, further comprising influencing the kinetic energy of the ions.

27. The method according to claim 25, further comprising converting at least a portion of the ions into radicals.

28. The method according to claim 27, wherein the ions are converted into the radicals by supplying electrons.

29. The method according to claim 25, wherein the molecular gas comprises at least one of hydrogen, deuterium, tritium, a noble gas, a halogen gas, oxygen, and nitrogen.

30. The method according to claim 25, wherein said exposing comprises a pulsed exposing of the component to the prepared gas.

31. The method according to claim 25, wherein the byproduct further comprises a material.

32. The cleaning module according to claim 25, wherein the ions directed to the component have masses in a given mass range and the byproduct further comprises ions in mass ranges other than the given mass range.

33. The method according to claim 25, further comprising filtering the prepared gas to filter out at least substantially all ions having masses in a predetermined mass range prior to said exposing.

34. The method according to claim 25, wherein the direction of travel of the byproduct differs from the initial direction of travel and from the altered direction of travel, and further comprising segregating the byproduct from the prepared gas and from the component prior to said exposing.

35. A method for cleaning a component mounted inside an extreme-ultraviolet lithography device, comprising:
generating a cleaning gas and a byproduct comprising a thermal beam with a heating filament,
confining the byproduct at a destination segregated from the component, and
deflecting the cleaning gas without the byproduct out of an initial flow direction of the cleaning gas and the byproduct onto the component while the component is mounted inside the extreme-ultraviolet lithography device with at least one of an electric field and a magnetic field, thereby decoupling the cleaning gas from the byproduct.

36. The method according to claim 35, further comprising ionizing the cleaning gas prior to said deflecting.

37. The method according to claim 36, further comprising filtering the cleaning gas with an electromagnetic field.

38. The method according to claim 35, wherein said deflecting comprises targeted scanning of the component.

39. The method according to claim 35, wherein said generating comprises generating atomic hydrogen.

40. The method according to claim 35, wherein the byproduct further comprises a material.

* * * * *

UNITED STATES PATENT AND TRADEMARK OFFICE
CERTIFICATE OF CORRECTION

| | | |
|---|---|---|
| PATENT NO. | : 9,046,794 B2 | Page 1 of 1 |
| APPLICATION NO. | : 12/883247 | |
| DATED | : June 2, 2015 | |
| INVENTOR(S) | : Hembacher et al. | |

It is certified that error appears in the above-identified patent and that said Letters Patent is hereby corrected as shown below:

In the claims

In column 11, line 25, in Claim 15, remove "the atomic gas" after "cleaning gas".

Signed and Sealed this
Fourteenth Day of June, 2016

Michelle K. Lee
*Director of the United States Patent and Trademark Office*